United States Patent
Kang et al.

(10) Patent No.: US 10,658,444 B2
(45) Date of Patent: May 19, 2020

(54) PIXEL AND DISPLAY DEVICE INCLUDING THE SAME

(71) Applicant: Samsung Display Co., Ltd., Yongin-si (KR)

(72) Inventors: Chul Kyu Kang, Yongin-si (KR); Won Kyu Kwak, Yongin-si (KR); Sang Moo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/220,670

(22) Filed: Dec. 14, 2018

(65) Prior Publication Data

US 2019/0386079 A1  Dec. 19, 2019

(30) Foreign Application Priority Data

Jun. 15, 2018 (KR) .................. 10-2018-0069104

(51) Int. Cl.
*H01L 27/32* (2006.01)

(52) U.S. Cl.
CPC ...... *H01L 27/3248* (2013.01); *H01L 27/3262* (2013.01); *H01L 27/3265* (2013.01); *H01L 27/3276* (2013.01)

(58) Field of Classification Search
CPC ............. H01L 27/3262; H01L 27/3276; H01L 27/3248; H01L 27/32
See application file for complete search history.

(56) References Cited

U.S. PATENT DOCUMENTS

2009/0219457 A1* 9/2009 Seo .................. G02F 1/136259
349/55

FOREIGN PATENT DOCUMENTS

KR   10-0001571768 B1   11/2015

* cited by examiner

*Primary Examiner* — Charles V Hicks
(74) *Attorney, Agent, or Firm* — H.C. Park & Associates, PLC

(57) ABSTRACT

A pixel and a display device having the pixel, the pixel including: a light emitting element; a first transistor configured to control, in response to a voltage of a first node coupled to a gate electrode thereof, current to be supplied from a first power supply coupled with a first electrode thereof to a second power supply via the light emitting element; a storage capacitor coupled between the first node and the first power supply; a second transistor coupled between a data line and the first transistor; an initialization transistor coupled between the light emitting element and an initialization power supply to transmit a voltage of the initialization power supply the light emitting element; and a dummy transistor coupled between the light emitting element and the initialization power supply, and including a first electrode and a second electrode that are coupled with each other.

15 Claims, 8 Drawing Sheets

PIXEL AND DISPLAY DEVICE INCLUDING THE SAME

CROSS-REFERENCE TO RELATED APPLICATION

This application claims priority from and the benefit of Korean Patent Application No. 10-2018-0069104, filed on Jun. 15, 2018, which is hereby incorporated by reference for all purposes as if fully set forth herein.

BACKGROUND

Field

Exemplary embodiments of the invention relate generally to a pixel and a display device including the pixel.

Discussion of the Background

An organic light-emitting display device displays an image using organic light-emitting diodes which generate light by recombination of electrons and holes. The organic light-emitting display device is advantageous in that it has a high response speed and is able to display a clear image.

Generally, the organic light-emitting display device includes a plurality of pixels, each of which includes a driving transistor and an organic light-emitting diode. Each pixel may control current to be supplied to the organic light-emitting diode using the driving transistor, thus expressing a corresponding gradation.

The above information disclosed in this Background section is only for understanding of the background of the inventive concepts, and, therefore, it may contain information that does not constitute prior art.

SUMMARY

Exemplary embodiments of the present invention are directed to preventing a display device from performance deterioration due to static electricity applied to the display device.

Additional features of the inventive concepts will be set forth in the description which follows, and in part will be apparent from the description, or may be learned by practice of the inventive concepts.

An exemplary embodiment of the present invention provides a pixel including: a light emitting element; a first transistor including a gate electrode, a first electrode, and a second electrode, and configured to control, in response to a voltage of a first node coupled to the gate electrode, current to be supplied from a first power supply coupled with the first electrode to a second power supply via the light emitting element; a storage capacitor coupled between the first node and the first power supply; a second transistor coupled between a data line and the first transistor; an initialization transistor coupled between the light emitting element and an initialization power supply and configured to transmit a voltage of the initialization power supply to a first electrode of the light emitting element; and a dummy transistor coupled between the light emitting element and the initialization power supply, and including a first electrode and a second electrode that are coupled with each other.

The initialization transistor may include: a first electrode coupled to a first electrode of the light emitting element; and a second electrode coupled to the dummy transistor.

The dummy transistor may include: a first electrode coupled to the second electrode of the initialization transistor; and a second electrode coupled to the initialization power supply.

The dummy transistor may include a first dummy transistor and a second dummy transistor. The first dummy transistor may include a first electrode coupled to the second electrode of the initialization transistor, and a second electrode coupled to the second dummy transistor. The second dummy transistor may include a first electrode coupled to the second electrode of the first dummy transistor, and a second electrode coupled to the initialization power supply.

The first electrode of the first dummy transistor and the second electrode of the second dummy transistor may be coupled to each other.

The initialization transistor may include: a first electrode coupled to the dummy transistor; and a second electrode coupled to the initialization power supply.

The dummy transistor may include: a first electrode coupled to a first electrode of the light emitting element; and a second electrode coupled to the initialization transistor.

The dummy transistor may include a first dummy transistor and a second dummy transistor. The first dummy transistor may include a first electrode coupled to the first electrode of the light emitting element, and a second electrode coupled to the second dummy transistor. The second dummy transistor may include a first electrode coupled to the second electrode of the first dummy transistor, and a second electrode coupled to the first electrode of the initialization transistor.

The first electrode of the first dummy transistor and the second electrode of the second dummy transistor may be coupled to each other.

The dummy transistor may include a gate electrode coupled to the initialization power supply.

Another exemplary embodiment of the present invention provides a display device including: a data driver configured to supply data signals to data lines; a scan driver configured to supply scan signals to scan lines; and pixels coupled to the data lines and the scan lines and arranged in a first direction and a second direction intersecting the first direction. Each of pixels included in an i-th (i is a natural number of 2 or more) pixel row includes: a light emitting element; a first transistor including a gate electrode, a first electrode, and a second electrode, and configured to control, in response to a voltage of a first node coupled to the gate electrode, current to be supplied from a first power supply coupled with the first electrode to a second power supply via the light emitting element; a storage capacitor coupled between the first node and the first power supply; a second transistor coupled between a data line and the first transistor; an initialization transistor coupled between the light emitting element and an initialization power supply and configured to transmit a voltage of the initialization power supply to a first electrode of the light emitting element; and a dummy transistor coupled between the light emitting element and the initialization power supply, and including a source electrode and a drain electrode that are coupled with each other.

Each of the first transistor, the second transistor, the initialization transistor, and the dummy transistor may include an active pattern, a source electrode coupled to a first side of the active pattern, and a drain electrode coupled to a second side of the active pattern. A semiconductor layer formed of active patterns, source electrodes, and drain electrodes of the first transistor, the second transistor, the initialization transistor, and the dummy transistor may extend in the second direction.

The dummy transistor may further include a gate electrode overlapping the active pattern in a plan view. The gate electrode may be formed of a part of an initialization power line extending in the first direction, the initialization power line being configured to transmit a voltage of the initialization power supply.

The source electrode and the drain electrode of the dummy transistor may be electrically coupled to the initialization power line.

The initialization transistor may receive the voltage of the initialization power supply via the dummy transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
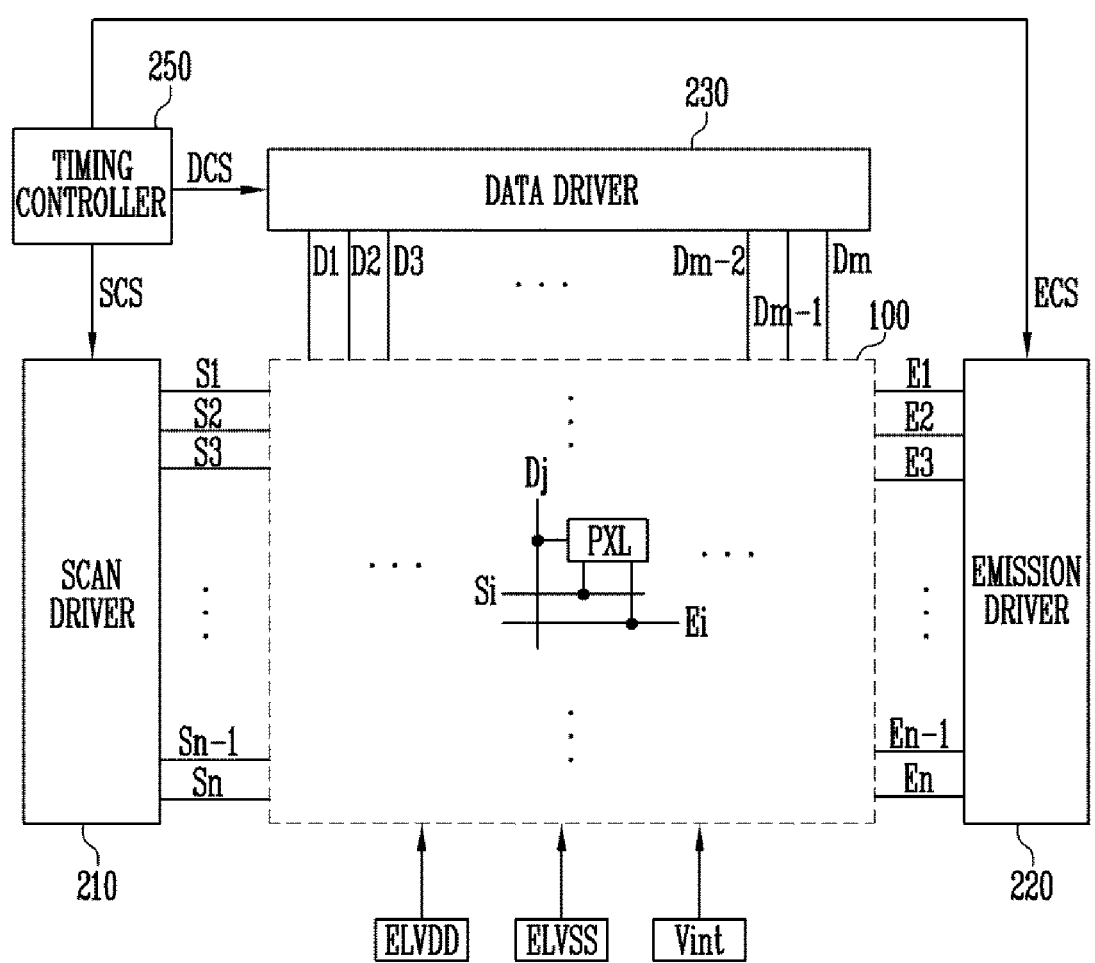
FIG. 1 is a diagram schematically illustrating the configuration of a display device in accordance with an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a pixel and a display device including the pixel in accordance with exemplary embodiments of the present disclosure will be described with reference to the accompanying drawings pertaining to the exemplary embodiments.

FIG. 1 is a diagram schematically illustrating the configuration of a display device in accordance with an exemplary embodiment of the present invention.

Referring to FIG. 1, the display device in accordance with an exemplary embodiment of the present invention may include a pixel unit 100, a scan driver 210, an emission driver 220, a data driver 230, and a timing controller 250.

The timing controller 250 may generate a scan driving control signal SCS, a data driving control signal DCS, and an emission driving control signal ECS, based on signals input from an external device. The scan driving control signal SCS generated from the timing controller 250 may be supplied to the scan driver 210. The data driving control signal DCS may be supplied to the data driver 230. The emission driving control signal ECS may be supplied to the emission driver 220.

Each of the scan driving control signal SCS and the emission driving control signal ECS may include at least one clock signal and a start pulse. The start pulse may control a timing of a first scan signal or a first emission control signal. The clock signal may be used to shift the start pulse.

The data driving control signal DCS may include a source start pulse and clock signals. The source start pulse may control a sampling start time of data, and the clock signals may be used to control a sampling operation.

The scan driver 210 may supply scan signals to scan lines Si to Sn in response to the scan driving control signal SCS. For example, the scan driver 210 may successively supply the scan signals to the scan lines S1 to Sn. When the scan signals are successively supplied to the scan lines Si to Sn, pixels PXL may be selected on a horizontal line basis. To this end, the scan signals may be set to a gate-on voltage (e.g., a low-level voltage) so that transistors included in the pixels PXL may be turned on.

The data driver 230 may supply data signals to data lines D1 to Dm in response to the data driving control signal DCS. The data signals supplied to the data lines D1 to Dm may be supplied to pixels PXL selected by the scan signals. For this operation, the data driver 230 may supply the data signals to the data lines D1 to Dm in synchronization with the scan signals.

The emission driver 220 may supply emission control signals to emission control lines E1 to En in response to the emission driving control signal ECS. For example, the emission driver 220 may successively supply the emission control signals to the emission control lines E1 to En. If the emission control signals are successively supplied to the emission control lines E1 to En, the pixels PXL may enter a non-emission state on a horizontal line basis. To this end, the emission control signals may be set to a gate-off voltage (e.g., a high-level voltage) so that the transistors included in the pixels PXL may be turned off.

Although the scan driver 210 and the emission driver 220 have been illustrated in FIG. 1 as being separate components, the inventive concepts are not limited thereto. For example, the scan driver 210 and the emission driver 220 may be formed as a single driver.

The scan driver 210 and/or the light-emitting driver 220 may be mounted on a substrate through a thin film process. Furthermore, the scan driver 210 and/or the emission driver 220 may be disposed on the opposite sides of the pixel unit 100.

The pixel unit 100 may include a plurality of pixels PXL that are coupled with the data lines D1 to Dm, the scan lines S1 to Sn, and the emission control lines E1 to En.

The pixels PXL may be supplied with an initialization power supply Vint, a first power supply ELVDD, and a second power supply ELVSS from an external device.

Each of the pixels PXL may be selected when a scan signal is supplied to a corresponding one of the scan lines S1 to Sn that is coupled with the pixel PXL, and then be supplied with a data signal from a corresponding one of the data lines D1 to Dm. The pixel PXL supplied with the data signal may control, in response to the data signal, current flowing from the first power supply ELVDD to the second power supply ELVSS via an organic light-emitting diode (not shown).

The organic light-emitting diode may generate light having a predetermined luminance in response to the current. In addition, the voltage of the first power supply ELVDD may be set to a value higher than that of the second power supply ELVSS.

Although each pixel PXL is illustrated in FIG. 1 as being coupled to a single scan line Si, a single data line Dj, and a single emission control line Ei, the present disclosure is not limited thereto. In other words, depending on a circuit structure of each pixel PXL, a plurality of scan lines S1 to Sn may be coupled to the pixel PXL, or a plurality of emission control lines E1 to En may be coupled to the pixel PXL.

In some cases, the pixels PXL may be coupled to only the scan lines S1 to Sn and the data lines D1 to Dm. In this case, the emission control lines E1 to En and the emission driver 220 for driving the emission control lines E1 to En may be omitted.

Figure 2:
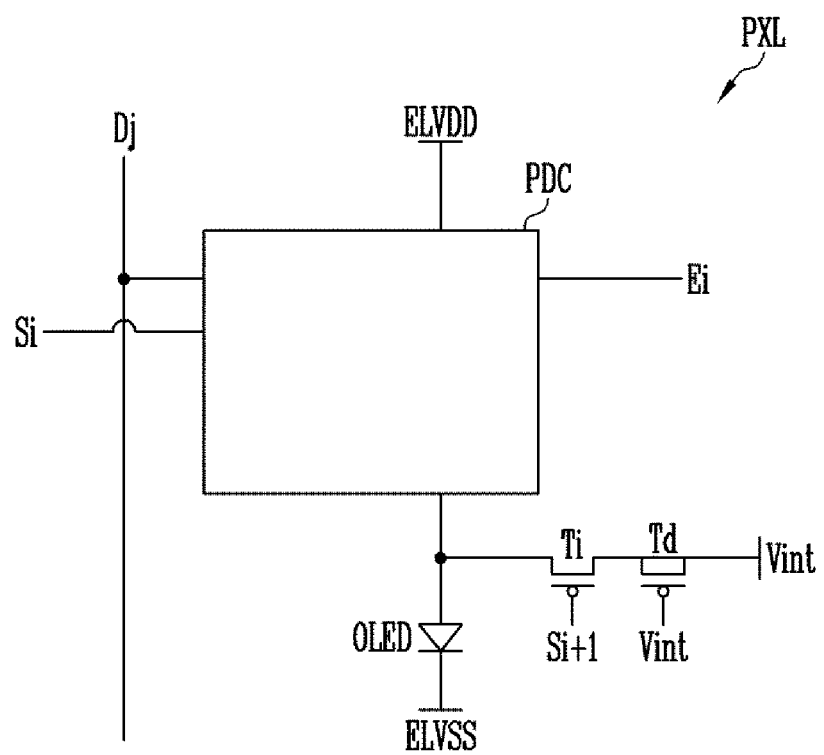
FIG. 2 is a diagram illustrating an exemplary embodiment of a pixel shown in FIG. 1.

FIG. 2 is a diagram illustrating an exemplary embodiment of a pixel PXL shown in FIG. 1.

In FIG. 2, for the sake of description, there is illustrated a pixel PXL that is disposed on an i-th horizontal line and coupled with a j-th data line Dj.

Referring to FIG. 2, the pixel PXL in accordance with an exemplary embodiment of the present invention may include an organic light-emitting diode OLED, a pixel driving circuit PDC configured to control current to be applied to the organic light-emitting diode OLED, an initialization transistor Ti configured to initialize an anode electrode of the organic light-emitting diode OLED to the initialization power supply, and a dummy transistor Td coupled to the initialization transistor Ti.

The anode electrode of the organic light-emitting diode OLED may be coupled to a pixel driving circuit PDC, and a cathode electrode thereof may be coupled to the second power supply ELVSS. The organic light-emitting diode OLED may emit light having a predetermined luminance corresponding to current supplied from the pixel driving circuit PDC.

The pixel driving circuit PDC may control, in response to a data signal, current flowing from the first power supply ELVDD to the second power supply ELVSS via the organic light-emitting diode OLED.

The initialization transistor Ti may include a first electrode coupled to the anode electrode of the organic light-emitting diode OLED, a second electrode coupled to a line for transmitting the initialization power supply via the dummy transistor Td, and a gate electrode configured to receive a scan signal.

The dummy transistor Td may be disposed between the initialization transistor Ti and the line for transmitting the initialization power supply. The first electrode and the second electrode of the dummy transistor Td may be electrically connected to each other.

Although in FIG. 2 the initialization power supply has been illustrated as being coupled to the gate electrode of the dummy transistor Td, the inventive concepts are not limited thereto. In some cases, the first power supply ELVDD, the scan line, or the emission control line may be coupled to the gate electrode of the dummy transistor Td.

Figure 3:
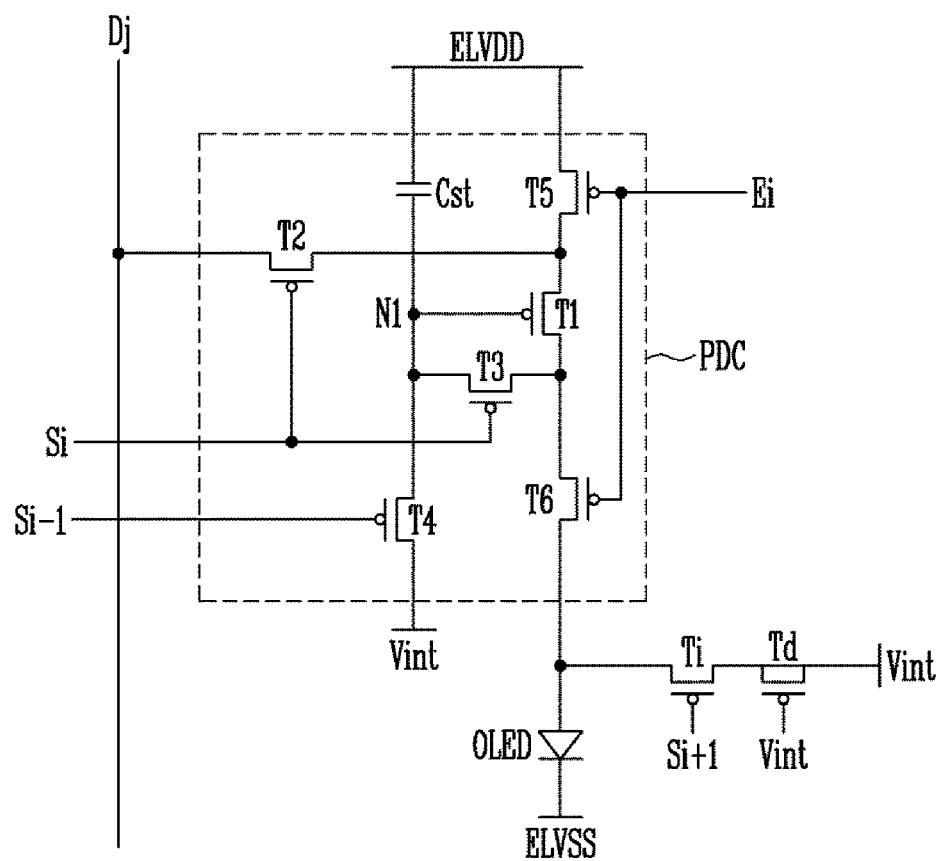
FIG. 3 is a schematic diagram illustrating an exemplary embodiment a pixel circuit shown in FIG. 2.

FIG. 3 is a diagram illustrating an exemplary embodiment the pixel circuit shown in FIG. 2.

Referring to FIG. 3, the pixel driving circuit PDC in accordance with an exemplary embodiment of the present invention may include first to sixth transistors T1 to T6, and a storage capacitor Cst.

The sixth transistor T6 may be coupled between the first transistor T1 and the organic light-emitting diode OLED. A gate electrode of the sixth transistor T6 may be coupled to an i-th emission control line Ei. The sixth transistor T6 may be turned off when an emission control signal is supplied to the i-th emission control line Ei, and may be turned on in other cases.

The fifth transistor T5 may be coupled between the first power supply ELVDD and the first transistor T1. A gate electrode of the fifth transistor T5 may be coupled to the i-th emission control line Ei. The fifth transistor T5 may be turned off when an emission control signal is supplied to the i-th emission control line Ei, and may be turned on in other cases.

A first electrode of the first transistor (T1; driving transistor) may be coupled to the first power supply ELVDD via the fifth transistor T5, and a second electrode thereof may be coupled to the anode of the organic light-emitting diode OLED via the sixth transistor T6. A gate electrode of the first transistor T1 may be coupled to a first node N1. The first transistor T1 may control, in correspondence with a voltage of the first node N1, current flowing from the first power supply ELVDD to the second power supply ELVSS via the organic light-emitting diode OLED.

The first power supply ELVDD may be set to a voltage higher than that of the second power supply ELVSS to allow current to flow to the organic light-emitting diode OLED.

The third transistor T3 may be coupled between a second electrode of the first transistor T1 and the first node N1. A gate electrode of the third transistor T3 may be coupled to the i-th scan line Si. When a scan signal is supplied to the i-th scan line Si, the third transistor T3 may be turned on so that the second electrode of the first transistor T1 can be electrically coupled with the first node N1. Therefore, when the third transistor T3 is turned on, the first transistor T1 may be connected in the form of a diode.

The fourth transistor T4 may be coupled between the first node N1 and the initialization power supply Vint. A gate electrode of the fourth transistor T4 may be coupled to the i−1-th scan line Si−1. When a scan signal is supplied to the i−1-th scan line Si−1, the fourth transistor T4 is turned on so that the voltage of the initialization power supply Vint may be supplied to the first node N1.

The second transistor T2 may be coupled between the m-th data line Dm and the first electrode of the first transistor T1. A gate electrode of the second transistor T2 may be coupled to the i-th scan line Si. When the scan signal is supplied to the i-th scan line Si, the second transistor T2 may be turned on so that the first electrode of the first transistor T1 may be electrically coupled with the m-th data line Dm.

The storage capacitor Cst may be coupled between the first power supply ELVDD and the first node N1. The storage capacitor Cst may store a voltage corresponding both to a data signal and to a threshold voltage of the first transistor T1.

The gate electrode of the initialization transistor Ti that is coupled between the initialization power supply Vint and the anode of the organic light-emitting diode OLED may be coupled to an i+1-th scan line Si+1. When a scan signal is supplied to the i+1-th scan line Si+1, the initialization transistor Ti may be turned on so that the voltage of the initialization power supply Vint may be supplied to the anode of the organic light-emitting diode OLED. The initialization power supply Vint may be set to a voltage lower than that of a data signal.

FIGS. 2 and 3 illustrate an example in which the i+1-th scan line Si+1 is coupled to the gate electrode of the initialization transistor Ti, but the inventive concepts are not limited thereto. For example, the gate electrode of the initialization transistor Ti may be coupled to the i-th scan line Si or the i−1-th scan line Si−1.

In an exemplary embodiment, the organic light-emitting diode OLED may generate light having various colors including red, green, and blue in response to current supplied from the driving transistor, but the inventive concepts are not limited thereto. For instance, the organic light-emitting diode OLED may generate white light depending on the current supplied from the driving transistor. In this case, a separate color filter or the like may be used to embody a color image.

Figure 4:
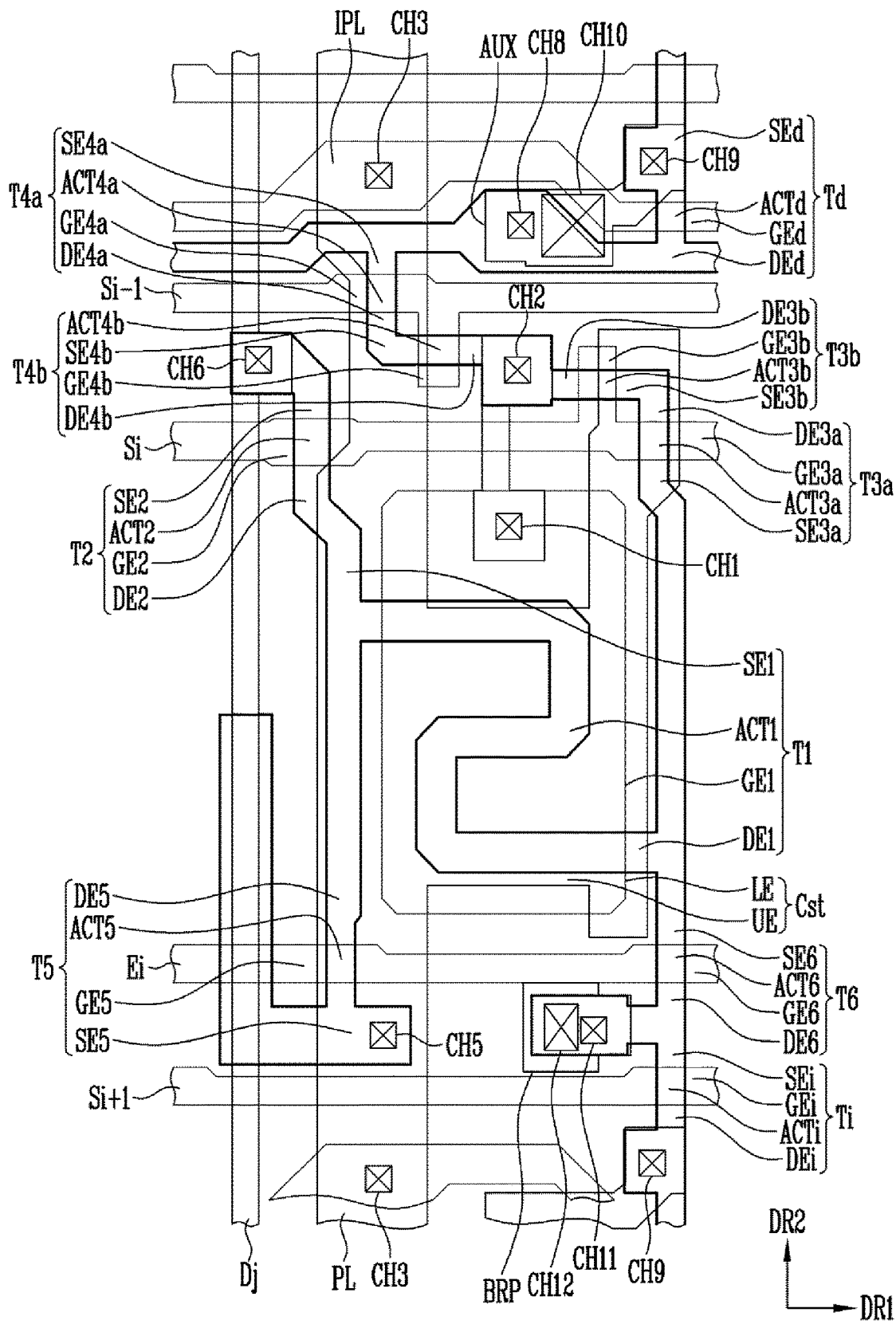
FIG. 4 is a plan view illustrating in detail the pixel shown in FIG. 3.

FIG. 4 is a plan view illustrating in detail the pixel PXL shown in FIG. 3.

FIG. 4 illustrates an example where, based on one pixel PXL disposed on the i-th horizontal line, three scan lines Si−1, Si, and Si+1, an emission control line Ei, a power line PL, and a data line Dj are coupled to the one pixel PXL. In FIG. 4, for the sake of description, a scan line of an i−1-th row refers to "i−1-th scan line Si−1", a scan line of an i-th row refers to "i-th scan line Si", a scan line of an i+1-th row refers to "i+1-th scan line Si+1", an emission control line of the i-th row refers to "emission control line Ei", a data line of a j-th column refers to "data line Dj", and a j-th power line refers to "power line PL".

Referring to FIGS. 3 and 4, the display device may include a line unit, pixels PXL, and a substrate for supporting the line unit and the pixels PXL.

The line unit may provide signals to each of the pixels PXL and include the scan lines Si−1, Si, and Si+1, the data line Dj, the emission control line Ei, the power line PL, and an initialization power line IPL.

The scan lines Si−1, Si and Si+1 may extend in a first direction DR1. The scan lines Si−1, Si, and Si+1 may include the i−1-th scan line Si−1, the i-th scan line Si, and the i+1-th scan line Si+1 which are successively arranged in a second direction DR2. The scan lines Si−1, Si, and Si+1 may receive scan signals. For instance, the i−1-th scan line Si−1 may receive an i−1-th scan signal. The i-th scan line Si may receive an i-th scan signal. The i+1-th scan line Si+1 may receive an i+1-th scan signal.

The emission control line Ei may extend in the first direction DR1. The emission control line Ei may be disposed between the i-th scan line Si and the i+1-th scan line Si+1 at a position spaced apart from the i-th scan line Si and the i+1-th scan line Si+1. The emission control line Ei may receive an emission control signal.

The data line Dj may extend in the second direction DR2. The data line Dj may receive a data signal.

The power line PL may extend in the second direction DR2. The power line PL may be disposed at a position spaced apart from the data line Dj. The first power supply (refer to ELVDD of FIGS. 1 and 3) may be applied to the power line PL.

The initialization power supply Vint may be applied to the initialization power line IPL. Initialization power lines IPL may be arranged in the second direction DR2.

Each of the pixels PXL may include the first transistor T1, the second transistor T2, the third transistor T3, the fourth transistor T4, the fifth transistor T5, the sixth transistor T6, the initialization transistor Ti, the dummy transistor Td, the storage capacitor Cst, and the organic light-emitting diode OLED.

The first transistor T1 may include a first gate electrode GE1, a first active pattern ACT1, a first source electrode SE1, a first drain electrode DE1, and a connection line CNL.

The first gate electrode GE1 may be coupled with a third drain electrode DE3 of the third transistor T3 and a fourth drain electrode DE4 of the fourth transistor T4. The connection line CNL may couple the first gate electrode GE1, the third drain electrode DE3, and the fourth drain electrode DE4 to each other. A first end of the connection line CNL is coupled with the first gate electrode GE through a first contact hole CH1. A second end of the connection line CNL may be coupled with the third drain electrode DE3 and the fourth drain electrode DE4 through a second contact hole CH2.

In an exemplary embodiment of the present invention, each of the first active pattern ACT1, the first source electrode SE1, and the first drain electrode DE1 may be formed of an undoped semiconductor layer or a semiconductor layer doped with an impurity. For example, each of the first source electrode SE1 and the first drain electrode DE1 may be formed of a semiconductor layer doped with an impurity. The first active pattern ACT1 may be formed of an undoped semiconductor layer.

The first active pattern ACT1 may have a bar shape, extending in a predetermined direction, and be bent several times along the longitudinal direction. The first active pattern ACT1 may overlap the first gate electrode GE1 in a plan view. Since the first active pattern ACT1 is relatively long, a channel area of the first transistor T1 may also be relatively long. Thus, a driving range of a gate voltage to be applied to the first transistor T1 may be increased. Consequently, the gradation of light emitted from the OLED may be precisely controlled.

The first source electrode SE1 may be coupled to a first end of the first active pattern ACT1. The first source electrode SE1 may be coupled with a second drain electrode DE2 of the second transistor T2 and a fifth drain electrode DE5 of the fifth transistor T5. The first drain electrode DE1 may be coupled to a second end of the first active pattern ACT1. The first drain electrode DE1 may be coupled with the third drain electrode DE3 of the third transistor T3 and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be coupled to the i-th scan line Si. The second gate electrode GE2 may be provided as a part of the i-th scan line Si or formed to have a shape protruding from the i-th scan line Si. In an embodiment of the present disclosure, each of the second active pattern ACT2, the second source electrode SE2, and the second drain electrode DE2 may be formed of an undoped semiconductor layer or a semiconductor layer doped with an impurity. For example, each of the second source electrode SE2 and the second drain electrode DE2 may be formed of a semiconductor layer doped with an impurity. The second active pattern ACT2 may be formed of an undoped semiconductor layer. The second active pattern ACT2 may correspond to a portion of the second transistor T2 that overlaps the second gate electrode GE2. A first end of the second source electrode SE2 may be coupled to the second active pattern ACT2. A second end of the second source electrode SE2 may be coupled to the data line Dj through a sixth contact hole CH6. A first end of the second drain electrode DE2 may be coupled to the second active pattern ACT2. A second end of the second drain electrode DE2 may be coupled with the first source electrode SE1 of the first transistor T1 and the fifth drain electrode DE5 of the fifth transistor T5.

The third transistor T3 may have a double gate structure to prevent current leakage. In other words, the third transistor T3 may include a 3a-th transistor T3*a*, and a 3b-th transistor T3*b*. The 3a-th transistor T3*a* may include a 3a-th gate electrode GE3*a*, a 3a-th active pattern ACT3*a*, a 3a-th source electrode SE3*a*, and a 3a-th drain electrode DE3*a*. The 3b-th transistor T3*b* may include a 3b-th gate electrode GE3*b*, a 3b-th active pattern ACT3*b*, a 3b-th source electrode SE3*b*, and a 3b-th drain electrode DE3*b*. Hereinbelow, the 3a-th gate electrode GE3*a* and the 3b-th gate electrode GE3*b* will be referred to as "third gate electrode GE3". The 3a-th active pattern ACT3*a* and the 3b-th active pattern ACT3*b* will be referred to as "third active pattern ACT3". The 3a-th source electrode SE3*a* and the 3b-th source electrode SE3*b* will be referred to as "third source electrode SE3". The 3a-th drain electrode DE3a and the 3b-th drain electrode DE3b will be referred to as "third drain electrode DE3".

The third gate electrode GE3 may be coupled to the i-th scan line Si. The third gate electrode GE3 may be provided as a part of the i-th scan line Si or formed to have a shape protruding from the i-th scan line Si. For example, the 3a-th gate electrode GE3a may have a shape protruding from the i-th scan line Si. The 3b-th gate electrode GE3b may be provided as a part of the i-th scan line Si.

Each of the third active pattern ACT3, the third source electrode SE3, and the third drain electrode DE3 may be formed of an undoped semiconductor layer or a semiconductor is layer doped with an impurity. For example, each of the third source electrode SE3 and the third drain electrode DE3 may be formed of a semiconductor layer doped with an impurity. The third active pattern ACT3 may be formed of an undoped semiconductor layer. The third active pattern ACT3 may correspond to a portion of the third transistor T3 that overlaps the third gate electrode GE3. A first end of the third source electrode SE3 may be coupled to the third active pattern ACT3. A second end of the third source electrode SE3 may be coupled with the first drain electrode DE1 of the first transistor T1 and the sixth source electrode SE6 of the sixth transistor T6. A first end of the third drain electrode DE3 may be coupled to the third active pattern ACT3. A second end of the third drain electrode DE3 may be coupled to the fourth drain electrode DE4 of the fourth transistor T4. The third drain electrode DE3 may be coupled to the first gate electrode GE1 of the first transistor T1 by the connection line CNL through the second contact hole CH2 and the first contact hole CH1.

The fourth transistor T4 may have a double gate structure to prevent current leakage. The fourth transistor T4 may include a 4a-th transistor, and a 4b-th transistor. The 4a-th transistor may include a 4a-th gate electrode GE4a, a 4a-th active pattern ACT4a, a 4a-th source electrode SE4a, and a 4a-th drain electrode DE4a. The 4b-th transistor may include a 4b-th gate electrode GE4b, a 4b-th active pattern ACT4b, a 4b-th source electrode SE4b, and a 4b-th drain electrode DE4b. Hereinbelow, the 4a-th gate electrode GE4a and the 4b-th gate electrode GE4b will be referred to as "fourth gate electrode GE4". The 4a-th active pattern ACT4a and the 4b-th active pattern ACT4b will be referred to as "fourth active pattern ACT4". The 4a-th source electrode SE4a and the 4b-th source electrode SE4b will be referred to as "fourth source electrode SE4". The 4a-th drain electrode DE4a and the 4b-th drain electrode DE4b will be referred to as "fourth drain electrode DE4".

The fourth gate electrode GE4 may be coupled to the i−1-th scan line Si−1. The fourth gate electrode GE4 may be provided as a part of the i−1-th scan line Si−1 or formed to have a shape protruding from the i−1-th scan line Si−1. For example, the 4a-th gate electrode GE4a may be provided as a part of the i−1-th scan line Si−1. The 4b-th gate electrode GE4b may be formed to have a shape protruding from the i−1-th scan line Si−1.

Each of the fourth active pattern ACT4, the fourth source electrode SE4, and the fourth drain electrode DE4 may be formed of an undoped semiconductor layer or a semiconductor layer doped with an impurity. For example, each of the fourth source electrode SE4 and the fourth drain electrode DE4 may be formed of a semiconductor layer doped with an impurity. The fourth active pattern ACT4 may be formed of an undoped semiconductor layer. The fourth active pattern ACT4 may correspond to a portion of the fourth transistor T4 that overlaps the fourth gate electrode GE4.

A first end of the fourth source electrode SE4 may be coupled to the fourth active pattern ACT4. A second end of the fourth source electrode SE4 may be coupled to the dummy transistor Td of the pixel PXL disposed on the i−1-th row. A first end of the fourth drain electrode DE4 may be coupled to the fourth active pattern ACT4. A second end of the fourth drain electrode DE4 may be coupled to the third drain electrode DE3 of the third transistor T3. The fourth drain electrode DE4 may be coupled to the first gate electrode GE1 of the first transistor T1 by the connection line CNL through the second contact hole CH2 and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be coupled to the emission control line Ei. The fifth gate electrode GE5 may be provided as a part of the emission control line Ei, or formed to have a shape protruding from the emission control line Ei. Each of the fifth active pattern ACT5, the fifth source electrode SE5, and the fifth drain electrode DE5 may be formed of an undoped semiconductor layer or a semiconductor layer doped with an impurity. For example, each of the fifth source electrode SE5 and the fifth drain electrode DE5 may be formed of a semiconductor layer doped with an impurity. The fifth active pattern ACT5 may be formed of an undoped semiconductor layer. The fifth active pattern ACT5 may correspond to a portion of the fifth transistor T5 that overlaps the fifth gate electrode GE5. A first end of the fifth source electrode SE5 may be coupled to the fifth active pattern ACT5. A second end of the fifth source electrode SE5 may be coupled to the power line PL through a fifth contact hole CH5. A first end of the fifth drain electrode DE5 may be coupled to the fifth active pattern ACT5. A second end of the fifth drain electrode DE5 may be coupled with the first source electrode SE1 of the first transistor T1 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be coupled to the emission control line Ei. The sixth gate electrode GE6 may be provided as a part of the emission control line Ei, or formed to have a shape protruding from the emission control line Ei. Each of the sixth active pattern ACT6, the sixth source electrode SE6, and the sixth drain electrode DE6 may be formed of an undoped semiconductor layer or a semiconductor layer doped with an impurity. For example, each of the sixth source electrode SE6 and the sixth drain electrode DE6 may be formed of a semiconductor layer doped with an impurity. The sixth active pattern ACT6 may be formed of an undoped semiconductor layer. The sixth active pattern ACT6 may correspond to a portion of is the sixth transistor T6 that overlaps the sixth gate electrode GE6. A first end of the sixth source electrode SE6 may be coupled to the sixth active pattern ACT6. A second end of the sixth source electrode SE6 may be coupled with the first drain electrode DE1 of the first transistor T1 and the third source electrode SE3 of the third transistor T3. A first end of the sixth drain electrode DE6 may be coupled to the sixth active pattern ACT6. A second end of the sixth drain electrode DE6 may be coupled to an initialization source electrode SEi of the initialization transistor Ti.

The initialization transistor Ti may include an initialization gate electrode GEi, an initialization active pattern ACTi, the initialization source electrode SEi, and an initialization drain electrode DEi.

The initialization gate electrode GEi may be coupled to the i+1-th scan line Si+1. The initialization gate electrode GEi may be provided as a part of the i+1-th scan line Si+1 or formed to have a shape protruding from the i+1-th scan line Si+1. Each of the initialization active pattern ACTi, the initialization source electrode SEi, and the initialization drain electrode DEi may be formed of an undoped semiconductor layer or a semiconductor layer doped with an impurity. For example, each of the initialization source electrode SEi and the initialization drain electrode DEi may be formed of a semiconductor layer doped with an impurity. The initialization active pattern ACTi may be formed of an undoped semiconductor layer. The initialization active pattern ACTi may correspond to a portion of the initialization transistor Ti that overlaps the initialization gate electrode GEi. A first end of the initialization source electrode SEi may be coupled to the initialization active pattern ACTi. A second end of the initialization source electrode SEi may be coupled to the sixth drain electrode DE6 of the sixth transistor T6. A first end of the initialization drain electrode DEi may be coupled to the initialization active pattern ACTi. A second end of the initialization drain electrode DEi may be coupled to a dummy source electrode SEd of the dummy transistor Td of the pixel PXL disposed on the i-1-th row. In other words, the initialization transistor Ti may be coupled to the initialization power line IPL by the dummy transistor Td.

The dummy transistor Td may include a dummy gate electrode GEd, a dummy active pattern ACTd, the dummy source electrode SEd, and a dummy drain electrode DEd.

The dummy gate electrode GEd may be coupled to the initialization power line IPL. The dummy gate electrode GEd may be provided as a part of the initialization power line IPL or formed to have a shape protruding from the initialization power line IPL. Each of the dummy active pattern ACTd, the dummy source electrode SEd, and the dummy drain electrode DEd may be formed of an undoped semiconductor layer or a semiconductor layer doped with an impurity. For example, each of the dummy source electrode SEd and the dummy drain electrode DEd may be formed of a semiconductor layer doped with an impurity. The dummy active pattern ACTd may be formed of an undoped semiconductor layer. The dummy active pattern ACTd may correspond to a portion of the dummy transistor Td that overlaps the dummy gate electrode GEd.

A first end of the dummy source electrode SEd may be coupled to the dummy active pattern ACTd. A second end of the dummy source electrode SEd may be coupled to a drain electrode DEi of an initialization transistor Ti of a pixel PXL disposed on another row.

A first end of the dummy drain electrode DEd may be coupled to the dummy active pattern ACTd. A second end of the dummy drain electrode DEd may be coupled to the fourth source electrode SE4 of the fourth transistor T4.

An auxiliary connection line AUX may be provided between the second end of the dummy source electrode SEd and the second end of the dummy drain electrode DEd. A first end of the auxiliary connection line AUX may be coupled with the second end of the dummy source electrode SEd through a ninth contact hole CH9. A second end of the auxiliary connection line AUX may be coupled with the second end of the dummy drain electrode DEd through an eighth contact hole CH8. In other words, the dummy source electrode SEd and the dummy drain electrode DEd may be electrically connected to each other.

The auxiliary connection line AUX may be coupled to the initialization power line IPL through a tenth contact hole CH10. Therefore, the initialization transistor Ti may be coupled to the initialization power line IPL through the dummy source electrode SEd, the ninth control hole CH9, the auxiliary connection line AUX, and the tenth contact hole CH10. Furthermore, the fourth transistor T4 may be coupled to the initialization power line IPL through the dummy drain electrode DEd, the eighth control hole CH8, the auxiliary connection line AUX, and the tenth contact hole CH10.

The storage capacitor Cst may include a lower electrode LE and an upper electrode UE. The lower electrode LE may be formed of the first gate electrode GE1 of the first transistor T1.

In a plan view, the upper electrode UE may overlap the lower electrode LE. The capacity of the storage capacity Cst may be increased as an overlapping area between the upper electrode UE and the lower electrode LE increases. The upper electrode UE may be coupled to the power line PL. The upper electrode UE may be provided in the form protruding from the power line PL in the first direction DR1. Therefore, the first power supply ELVDD may be applied to the upper electrode UE.

Although not shown, a first electrode and a second electrode of the organic light-emitting diode OLED, and an emissive layer provided between the first electrode and the second electrode may be provided in the pixel PXL.

The first electrode may be a pixel electrode provided in an emission area corresponding to the associated pixel PXL. In a plan view, the first electrode may have a shape covering most of the area of the corresponding PXL. Alternatively, the first electrode may be formed such that it does not overlap some transistors. The first electrode may be coupled to the initialization source electrode SEi of the initialization transistor Ti and the second drain electrode DE6 of the sixth transistor T6 through an eleventh contact hole CH11 and a twelfth contact hole CH12. A bridge pattern BRP may be provided between the eleventh contact hole CH11 and the twelfth contact hole CH12. In detail, the first electrode may be coupled to the bridge pattern BRP through the twelfth contact hole CH12. The bridge pattern BRP may be coupled to the initialization source electrode SEi of the initialization transistor Ti and the sixth drain electrode DE6 of the sixth transistor T6 through the eleventh contact hole CH11.

The emissive layer and the second electrode may be successively stacked on the first electrode in a third direction perpendicular to a plane extending in the first direction and the second direction. The second electrode may be coupled to the second power supply ELVSS.

Figure 5:
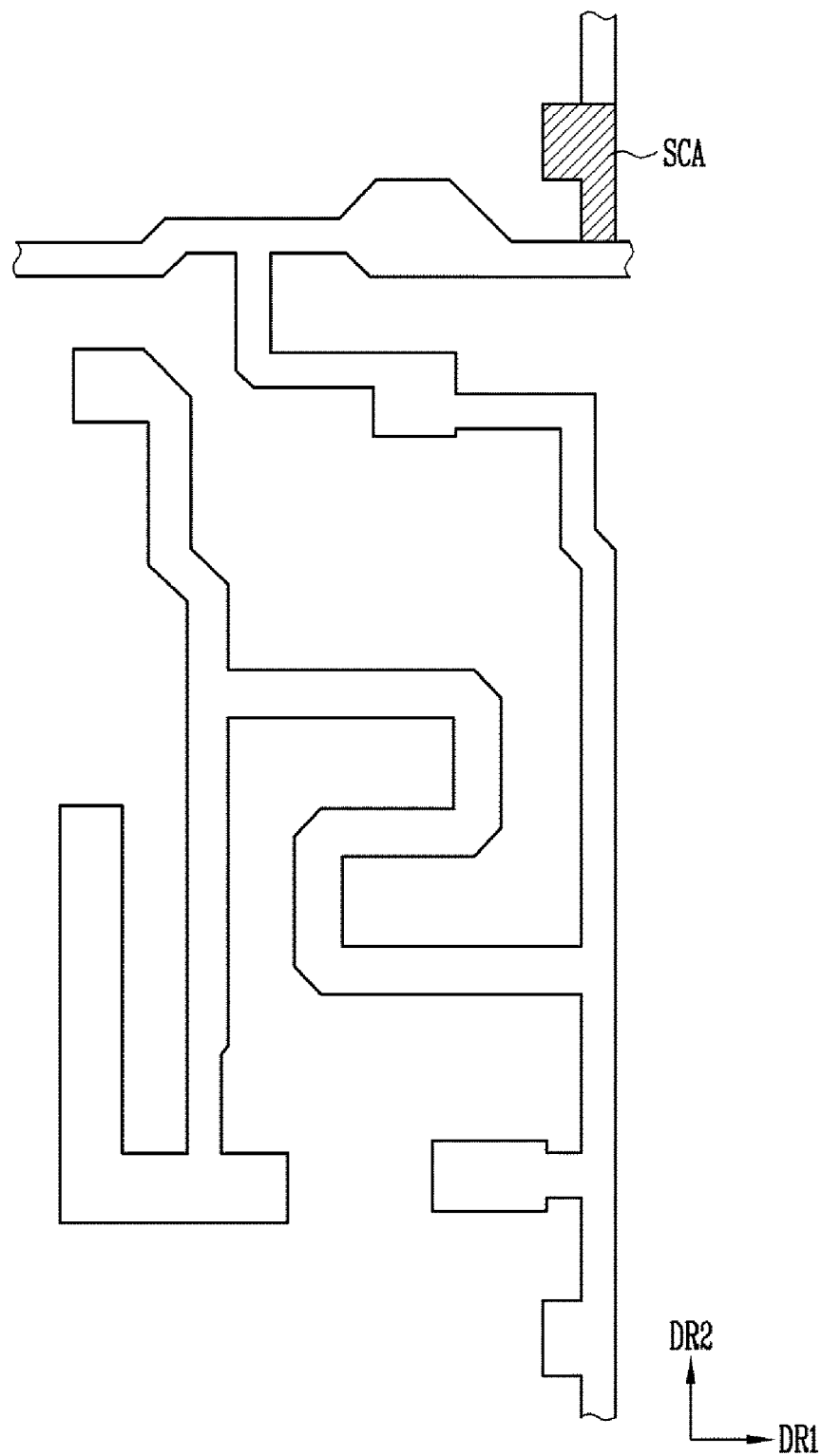
FIG. 5 is a plan view for describing a semiconductor layer shown in FIG. 4.

FIG. 5 is a plan view illustrating the active patterns, the source electrodes, and the drain electrodes shown in FIGS. 3 and 4.

Referring to FIG. 5, a semiconductor pattern may include the first to sixth active patterns ACT1 to ACT6, the initialization active pattern ACTi, the dummy active pattern ACTd, the first to sixth source electrodes SE1 to SE6, the initialization source electrode SEi, the dummy source electrode SEd, the first to sixth drain electrodes DE1 to DE6, the initialization drain electrode DEi, and the dummy drain electrode DEd.

The first to sixth active patterns ACT1 to ACT6, the initialization active pattern ACTi, the dummy active pattern ACTd, the first to sixth source electrodes SE1 to SE6, the initialization source electrode SEi, the dummy source electrode SEd, the first to sixth drain electrodes DE1 to DE6, the initialization drain electrode DEi, and the dummy drain electrode DEd may be provided on the same layer and formed through the same process, and may include a semiconductor material.

The first end of the first active pattern ACT1 may be coupled to the first source electrode SE1, and the second end thereof may be coupled to the first drain electrode DE1. A first end of the second active pattern ACT2 may be coupled to the second source electrode SE2, and a second end thereof may be coupled to the second drain electrode DE2. A first end of the third active pattern ACT3 may be coupled to the third source electrode SE3, and a second end thereof may be coupled to the third drain electrode DE3. A first end of the fourth active pattern ACT4 may be coupled to the fourth source electrode SE4, and a second end thereof may be coupled to the fourth drain electrode DE4. A first end of the fifth active pattern ACT5 may be coupled to the fifth source electrode SE5, and a second end thereof may be coupled to the fifth drain electrode DE5. A first end of the sixth active pattern ACT6 may be coupled to the sixth source electrode SE6, and a second end thereof may be coupled to the sixth drain electrode DE6. A first end of the initialization active pattern ACTi may be coupled to the initialization source electrode SEi, and a second end thereof may be coupled to the initialization drain electrode DEi. A first end of the dummy active pattern ACTd may be coupled to the dummy source electrode SEd, and a second end thereof may be coupled to the dummy drain electrode DEd.

The semiconductor layer in accordance with an exemplary embodiment of the present invention may be formed to extend in the second direction DR2. In other words, the initialization drain electrode DEi of the initialization transistor Ti of the pixel disposed on the i-th row may be coupled with the dummy source electrode SEd of the dummy transistor Td of the pixel disposed on the i+1-th row.

In a display device according to the conventional art, the semiconductor layer does not extend in the second direction DR2. In detail, a semiconductor layer of the display device according to the conventional art has a shape in which the semiconductor layer is not formed in a portion corresponding to area SCA shown in FIG. 5. During a process of manufacturing the display device according to the conventional art, if static electricity is applied to the semiconductor layer, charges may not be sufficiently widely dispersed, whereby the semiconductor layer may short (or open). Alternatively, there may be a problem of causing a deviation in characteristics between transistors disposed around an area to which static electricity is applied.

In an effort to overcome the foregoing problems, the semiconductor layer in accordance with an exemplary embodiment of the present invention may be formed to extend in the second direction DR2. As the semiconductor layer extends, each pixel PXL may further include a dummy transistor Td.

Figure 6:
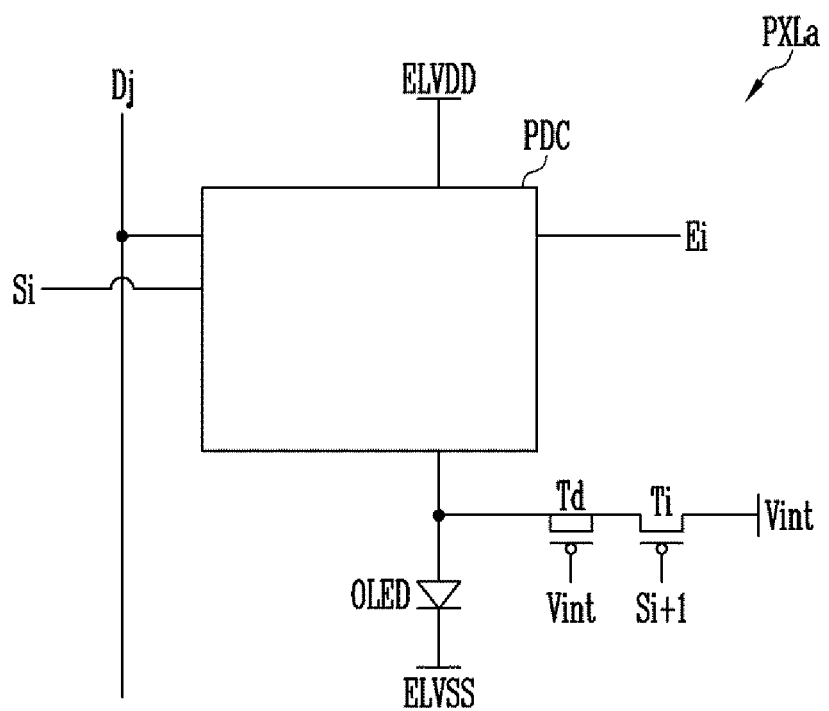
FIG. 6, FIG. 7, and FIG. 8 are diagrams illustrating exemplary embodiments of the pixel shown in FIG. 1.
Figure 7:
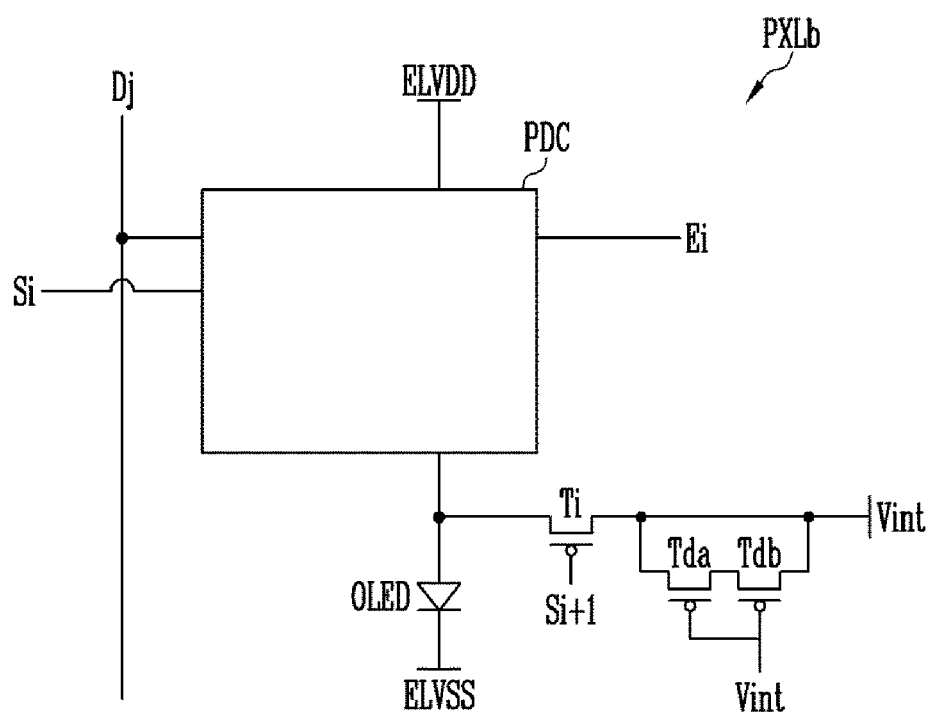
Figure 8:
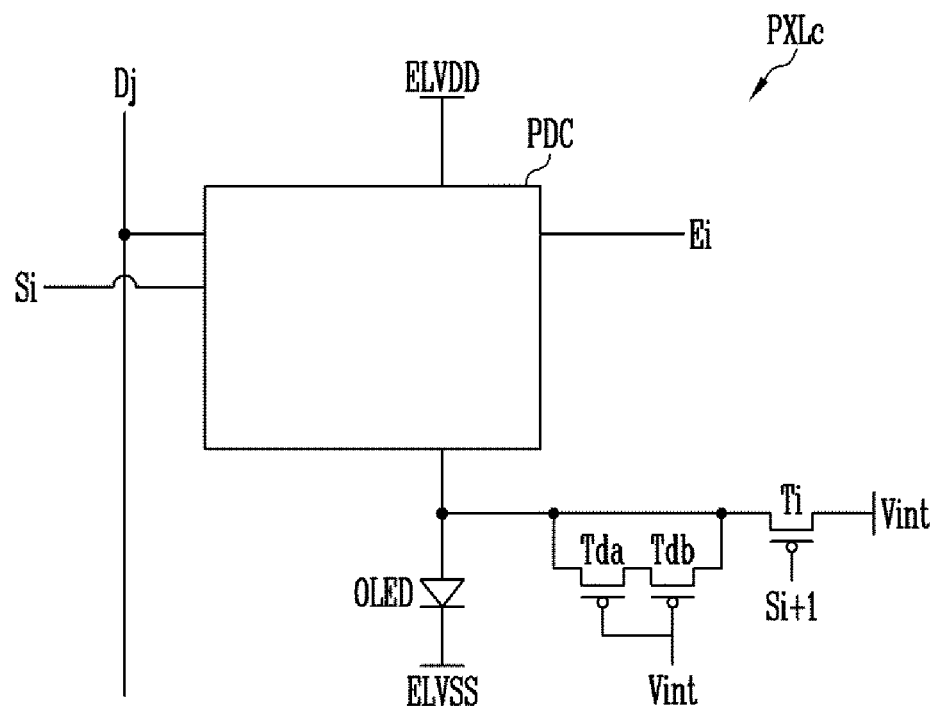

FIGS. 6 to 8 are diagrams illustrating exemplary embodiments of the pixel PXL shown in FIG. 1. In FIGS. 6 to 8, for the sake of description, there is illustrated a pixel that is disposed on an i-th horizontal line and coupled with a j-th data line Dj. Furthermore, the following descriptions with reference to FIGS. 6 to 8 will be focused on differences from the exemplary embodiment described with reference to FIG. 2, and repetitive explanations will be omitted if deemed redundant.

Referring to FIG. 6, a pixel PXLa in accordance with an exemplary embodiment of the present invention may include an organic light-emitting diode OLED, a pixel driving circuit PDC configured to control current to be applied to the organic light-emitting diode OLED, an initialization transistor Ti configured to initialize an anode electrode of the organic light-emitting diode OLED to an initialization power supply, and a dummy transistor Td coupled to the initialization transistor Ti.

The initialization transistor Ti may include a first electrode coupled to the anode electrode of the organic light-emitting diode OLED via the dummy transistor Td, a second electrode coupled to a line for transmitting the initialization power supply, and a gate electrode configured to receive a scan signal.

The dummy transistor Td may be disposed between the initialization transistor Ti and the organic light-emitting diode OLED. The first electrode and the second electrode of the dummy transistor Td may be electrically connected to each other.

Referring to FIG. 7, a pixel PXLb in accordance with an embodiment of the present disclosure may include an organic light-emitting diode OLED, a pixel driving circuit PDC configured to control current to be applied to the organic light-emitting diode OLED, an initialization transistor Ti configured to initialize an anode electrode of the organic light-emitting diode OLED to an initialization power supply, and dummy transistors Tda and Tdb coupled to the initialization transistor Ti.

The initialization transistor Ti may include a first electrode coupled to the anode electrode of the organic light-emitting diode OLED, a second electrode coupled to a line for transmitting the initialization power supply via the dummy transistors Tda and Tdb, and a gate electrode configured to receive a scan signal.

The dummy transistors Tda and Tdb may include a first dummy transistor Tda and a second dummy transistor Tdb and be disposed between the initialization transistor Ti and the organic light-emitting diode OLED. The second electrode of the first dummy transistor Tda and the first electrode of the second dummy transistor Tdb may be coupled to each other. Furthermore, the first electrode of the first dummy transistor Tda and the second electrode of the second dummy transistor Tdb may be electrically coupled to each other.

Referring to FIG. 8, a pixel PXLc in accordance with an exemplary embodiment of the present invention may include an organic light-emitting diode OLED, a pixel driving circuit PDC configured to control current to be applied to the organic light-emitting diode OLED, an initialization transistor Ti configured to initialize an anode electrode of the organic light-emitting diode OLED to an initialization power supply, and dummy transistors Tda and Tdb coupled to the initialization transistor Ti.

The initialization transistor Ti may include a first electrode coupled to the anode electrode of the organic light-emitting diode OLED via the dummy transistors Tda and Tdb, a second electrode coupled to a line for transmitting the initialization power supply, and a gate electrode configured to receive a scan signal.

The dummy transistors Tda and Tdb may include a first dummy transistor Tda and a second dummy transistor Tdb and be disposed between the initialization transistor Ti and the organic light-emitting diode OLED. The second electrode of the first dummy transistor Tda and the first electrode of the second dummy transistor Tdb may be coupled to each other. Furthermore, the first electrode of the first dummy transistor Tda and the second electrode of the second dummy transistor Tdb may be electrically coupled to each other.

Although in FIGS. 6 to 8 the initialization power supply has been illustrated as being coupled to the gate electrode of the dummy transistor Td, Tda, Tdb, the inventive concepts are not limited thereto. In some cases, the first power supply ELVDD, the scan line, or the emission control line may be coupled to the gate electrode of the dummy transistor Td, Tda, Tdb.

Various exemplary embodiments of the present disclosure may provide a semiconductor layer having a shape capable of efficiently dispersing charges generated by static electricity applied to a display device, thereby preventing performance of the display device from deteriorating due to static electricity.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A pixel comprising:
    a light emitting element;
    a first transistor comprising a gate electrode, a first electrode, and a second electrode, and configured to control, in response to a voltage of a first node coupled to the gate electrode, current to be supplied from a first power supply coupled with the first electrode to a second power supply via the light emitting element;
    a storage capacitor coupled between the first node and the first power supply;
    a second transistor coupled between a data line and the first transistor;
    an initialization transistor coupled between the light emitting element and an initialization power supply and configured to transmit a voltage of the initialization power supply to a first electrode of the light emitting element; and
    a dummy transistor coupled between the light emitting element and the initialization power supply, and comprising a first electrode and a second electrode that are coupled with each other.

2. The pixel according to claim 1, wherein the initialization transistor comprises:
    a first electrode coupled to a first electrode of the light emitting element; and
    a second electrode coupled to the dummy transistor.

3. The pixel according to claim 2, wherein the dummy transistor comprises:
    a first electrode coupled to the second electrode of the initialization transistor; and
    a second electrode coupled to the initialization power supply.

4. The pixel according to claim 3, wherein:
    the dummy transistor comprises a first dummy transistor and a second dummy transistor;
    the first dummy transistor comprises a first electrode coupled to the second electrode of the initialization transistor, and a second electrode coupled to the second dummy transistor; and
    the second dummy transistor comprises a first electrode coupled to the second electrode of the first dummy transistor, and a second electrode coupled to the initialization power supply.

5. The pixel according to claim 4, wherein the first electrode of the first dummy transistor and the second electrode of the second dummy transistor are coupled to each other.

6. The pixel according to claim 1, wherein the initialization transistor comprises:
    a first electrode coupled to the dummy transistor; and
    a second electrode coupled to the initialization power supply.

7. The pixel according to claim 6, wherein the dummy transistor comprises:
    a first electrode coupled to a first electrode of the light emitting element; and
    a second electrode coupled to the initialization transistor.

8. The pixel according to claim 7, wherein:
    the dummy transistor comprises a first dummy transistor and a second dummy transistor;
    the first dummy transistor comprises a first electrode coupled to the first electrode of the light emitting element, and a second electrode coupled to the second dummy transistor; and
    the second dummy transistor comprises a first electrode coupled to the second electrode of the first dummy transistor, and a second electrode coupled to the first electrode of the initialization transistor.

9. The pixel according to claim 8, wherein the first electrode of the first dummy transistor and the second electrode of the second dummy transistor are coupled to each other.

10. The pixel according to claim 1, wherein the dummy transistor comprises a gate electrode coupled to the initialization power supply.

11. A display device comprising:
    a data driver configured to supply data signals to data lines;
    a scan driver configured to supply scan signals to scan lines; and
    pixels coupled to the data lines and the scan lines and arranged in a first direction and a second direction intersecting the first direction,
    wherein each of pixels included in an i-th (i is a natural number of 2 or more) pixel row comprises:
    a light emitting element;
    a first transistor comprising a gate electrode, a first electrode, and a second electrode, and configured to control, in response to a voltage of a first node coupled to the gate electrode, current to be supplied from a first power supply coupled with the first electrode to a second power supply via the light emitting element;
    a storage capacitor coupled between the first node and the first power supply;
    a second transistor coupled between a data line and the first transistor;
    an initialization transistor coupled between the light emitting element and an initialization power supply and configured to transmit a voltage of the initialization power supply to a first electrode of the light emitting element; and
    a dummy transistor coupled between the light emitting element and the initialization power supply, and comprising a source electrode and a drain electrode that are coupled with each other.

12. The display device according to claim 11, wherein:
    each of the first transistor, the second transistor, the initialization transistor, and the dummy transistor comprises an active pattern, a source electrode coupled to a first side of the active pattern, and a drain electrode coupled to a second side of the active pattern; and a semiconductor layer formed of active patterns, source electrodes, and drain electrodes of the first transistor, the second transistor, the initialization transistor, and the dummy transistor extends in the second direction.

13. The display device according to claim 12, wherein:

the dummy transistor further comprises a gate electrode overlapping the active pattern in a plan view; and the gate electrode is formed of a part of an initialization power line extending in the first direction, the initialization power line being configured to transmit a voltage of the initialization power supply.

14. The display device according to claim 13, wherein the source electrode and the drain electrode of the dummy transistor are electrically coupled to the initialization power line.

15. The display device according to claim 13, wherein the initialization transistor is configured to receive the voltage of the initialization power supply via the dummy transistor.

\* \* \* \* \*